(12) United States Patent
Nakagawa

(10) Patent No.: US 11,024,503 B2
(45) Date of Patent: Jun. 1, 2021

(54) LASER ANNEALING DEVICE, MASK, THIN FILM TRANSISTOR, AND LASER ANNEALING METHOD

(71) Applicant: SAKAI DISPLAY PRODUCTS CORPORATION, Sakai (JP)

(72) Inventor: Hidetoshi Nakagawa, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 164 days.

(21) Appl. No.: 16/082,059

(22) PCT Filed: Mar. 4, 2016

(86) PCT No.: PCT/JP2016/056822
§ 371 (c)(1),
(2) Date: Oct. 29, 2018

(87) PCT Pub. No.: WO2017/149767
PCT Pub. Date: Sep. 8, 2017

(65) Prior Publication Data
US 2020/0303193 A1  Sep. 24, 2020

(51) Int. Cl.
*H01L 21/268* (2006.01)
*H01L 21/02* (2006.01)
*B23K 26/066* (2014.01)
*H01L 21/477* (2006.01)

(52) U.S. Cl.
CPC .......... *H01L 21/268* (2013.01); *B23K 26/066* (2015.10); *H01L 21/0268* (2013.01); *H01L 21/477* (2013.01)

(58) Field of Classification Search
None
See application file for complete search history.

(56) References Cited

U.S. PATENT DOCUMENTS

| | | |
|---|---|---|
| 7,033,915 B2 | 4/2006 | Ryu et al. |
| 7,217,642 B2 | 5/2007 | Kang et al. |
| 7,651,931 B2 | 1/2010 | Nakayama et al. |
| 7,781,765 B2 | 8/2010 | Kang et al. |
| 2005/0079693 A1 | 4/2005 | Kang et al. |

(Continued)

FOREIGN PATENT DOCUMENTS

| | | |
|---|---|---|
| JP | 2005-510063 A | 4/2005 |
| JP | 2005-159285 A | 6/2005 |

(Continued)

*Primary Examiner* — Asok K Sarkar
(74) *Attorney, Agent, or Firm* — ScienBiziP, P.C.

(57) ABSTRACT

To provide a laser annealing device capable of performing annealing whereby electron mobility is different depending on the part, a mask, a thin film transistor, and a laser annealing method. A laser annealing device of the present invention is provided with a mask in which a plurality of openings are formed along the scanning direction, moves a substrate in the scanning direction, and irradiates the substrate with laser light via the openings. The openings respectively have first opening regions, which are aligned in the scanning direction, and which have a same shape, and some of the openings among the openings respectively have second opening regions continuous to the first opening regions in the predetermined direction with respect to the first opening regions.

13 Claims, 17 Drawing Sheets

(56) References Cited

U.S. PATENT DOCUMENTS

| | | | |
|---|---|---|---|
| 2005/0112809 A1* | 5/2005 | Ryu | H01L 27/1285 |
| | | | 438/166 |
| 2005/0287773 A1 | 12/2005 | Nakayama et al. | |
| 2007/0187846 A1 | 8/2007 | Kang et al. | |
| 2007/0290200 A1* | 12/2007 | Asano | H01L 27/1296 |
| | | | 257/40 |

FOREIGN PATENT DOCUMENTS

| | | |
|---|---|---|
| JP | 2006-013050 A | 1/2006 |
| JP | 2008-098464 A | 4/2008 |
| JP | 2012-104655 A | 5/2012 |
| JP | 5470519 B2 | 4/2014 |

* cited by examiner

Pattern A

Pattern B

Pattern C

Pattern D

LASER ANNEALING DEVICE, MASK, THIN FILM TRANSISTOR, AND LASER ANNEALING METHOD

TECHNICAL FIELD

The present invention relates to a laser annealing device that irradiates a substrate with laser light via openings in a mask, a mask included in the laser annealing device, a thin film transistor subjected to laser annealing using the laser annealing device, and a laser annealing method using the laser annealing device.

BACKGROUND ART

A liquid-crystal display of a thin film transistor (TFT) system includes a TFT substrate and a color filter substrate having a red (R) color, a green (G) color, and a blue (B) color. The TFT substrate and the color filter substrate are combined together in such a manner that there is a specific space between the TFT substrate and the color filter substrate. A liquid crystal is injected into the space between the TFT substrate and the color filter substrate. The liquid-crystal display can display an image by controlling light transmittance of liquid crystal molecules on a pixel-by-pixel basis.

Data lines and scan lines are arranged on the TFT substrate in a lengthwise direction and in a transverse direction to form a grid pattern. Pixels constituted by TFTs are formed at intersections of the data lines and the scan lines. Also, a drive circuit that drives the data lines and the scan lines constituted by TFTs is formed to surround a display area constituted by a plurality of pixels.

Development has been made on TFTs such as an amorphous silicon (non-crystalline, a-Si) TFT using a silicon semiconductor and a low-temperature polysilicon (polycrystal, p-Si) TFT produced by forming a semiconductor layer into polysilicon. The a-Si TFT has high resistance and causes less leakage current (leak current). The p-Si TFT achieves significantly high electron mobility as compared to the a-Si TFT.

A polysilicon layer can be formed from an amorphous silicon layer by annealing through irradiation of the amorphous silicon layer with laser light. An example of laser annealing devices forms laser light emitted from a laser light source into parallel beams using a group of lenses, and irradiates a substrate with the parallel beams via a light shield member having openings and a microlens array. The light shield member included in such a laser annealing device has a specific number of openings arranged in a scanning direction of the substrate. The laser annealing device performs irradiation with laser light every time the substrate is moved by a pitch between adjacent openings. Accordingly, a specific part of the substrate is irradiated with the laser light a number of times equal to the number of the openings in one cycle of scanning. Thus, the substrate can be irradiated with the same amount of laser light in each cycle (see Patent Literature 1).

CITATION LIST

Patent Literature

[Patent Literature 1]
Japanese Patent Publication No. 5470519

SUMMARY OF INVENTION

Technical Problem

However, the traditional laser annealing device irradiates the specific part of the substrate with the same amount of laser light in each cycle of scanning. Therefore, in a case where the specific part includes for example: a gap portion between a source electrode and a drain electrode; and under-electrode regions respectively located directly under a part of the source electrode and a part of the drain electrode, electron mobility increases in polysilicon layers respectively constituting the gap portion and the under-electrode regions by similar degrees, resulting in an increase in leakage current from TFTs.

The present invention was made in view of the foregoing and has its object of providing: a laser annealing device capable of performing annealing to achieve different degrees of electron mobility locally; a mask included in the laser annealing device; a thin film transistor subjected to laser annealing using the laser annealing device; and a laser annealing method using the laser annealing device.

Solution to Problem

A laser annealing device according to an embodiment of the present invention includes a mask that has a plurality of openings arranged in a scanning direction. The laser annealing device irradiates a substrate with laser light via the openings. Each of the plurality of openings includes a first opening area. The respective first opening areas have the same shape and are arranged in a line in the scanning direction. At least one opening among the plurality of openings includes a second opening area that is located in a specific direction with respect to the first opening area and continuous with the first opening area.

A mask according to an embodiment of the present invention has a plurality of openings arranged in a scanning direction of a substrate. Each of the plurality of openings includes a first opening area. The respective first opening areas have the same shape and are arranged in a line in the scanning direction. At least one opening among the plurality of openings includes a second opening area that is located in a specific direction with respect to the first opening area and continuous with the first opening area.

A thin film transistor according to an embodiment of the present invention includes: a gate electrode disposed on a surface of a substrate; an amorphous semiconductor film disposed above the gate electrode; a source electrode disposed on the amorphous semiconductor film; a drain electrode disposed on the amorphous semiconductor film; under-electrode crystalline semiconductor films constituted by annealed portions of the amorphous semiconductor film respectively located directly under a part of the source electrode and a part of the drain electrode, which portions being annealed using the laser annealing device of the above embodiment; and an inter-electrode crystalline semiconductor film constituted by an annealed portion of the amorphous semiconductor film located between the source electrode and the drain electrode, which portion being annealed using the laser annealing device of the above embodiment. The inter-electrode crystalline semiconductor film has higher electron mobility than the under-electrode crystalline semiconductor films.

A laser annealing method according to an embodiment of the present invention uses the laser annealing device according to the above embodiment. The laser annealing method includes moving a position of one of a substrate and a mask relative to a position of the other of the substrate and the mask in a scanning direction, and irradiating the substrate with laser light via a plurality of openings in the mask.

Advantageous Effects of Invention

According to the embodiments of the present invention, annealing can be performed to achieve different degrees of electron mobility locally.

DESCRIPTION OF EMBODIMENTS

Figure 1:
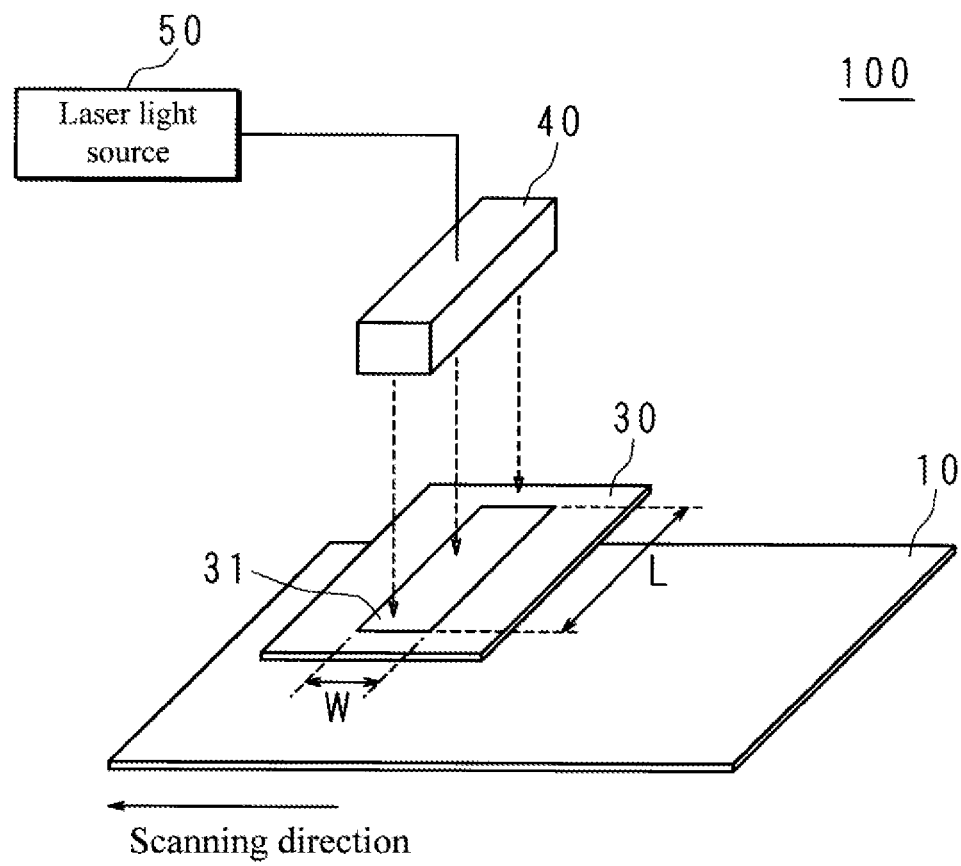
FIG. 1 is a schematic diagram illustrating an example of configuration of a laser annealing device of the present embodiment.

The following describes the present invention with reference to drawings illustrating an embodiment of the present invention. FIG. 1 is a schematic diagram illustrating an example of configuration of a laser annealing device 100 of the present embodiment. The laser annealing device 100 of the present embodiment includes for example: a laser light source 50 that emits laser light; an optical system 40 including a group of lenses for forming the laser light emitted from the laser light source 50 into parallel beams; and a mask (light shield plate) 30 including a mask portion 31 in which openings and microlenses, which will be described later, are arranged in an array. A substrate 10 is locally irradiated in specific parts of the substrate 10 with the parallel beams formed by the optical system 40 via the openings and the microlenses provided in the mask portion 31. Also, the substrate 10 is conveyed by a non-illustrated drive mechanism at a constant speed. The laser light source 50 irradiates the substrate 10 with the laser light at time intervals at which a to-be-irradiated position of the substrate 10 reaches positions corresponding to the openings. Note that the laser annealing device 100 may alternatively be configured to fix the substrate 10 and move the mask 30, rather than moving the substrate 10. The following describes a case where the substrate 10 is moved.

Figure 2:
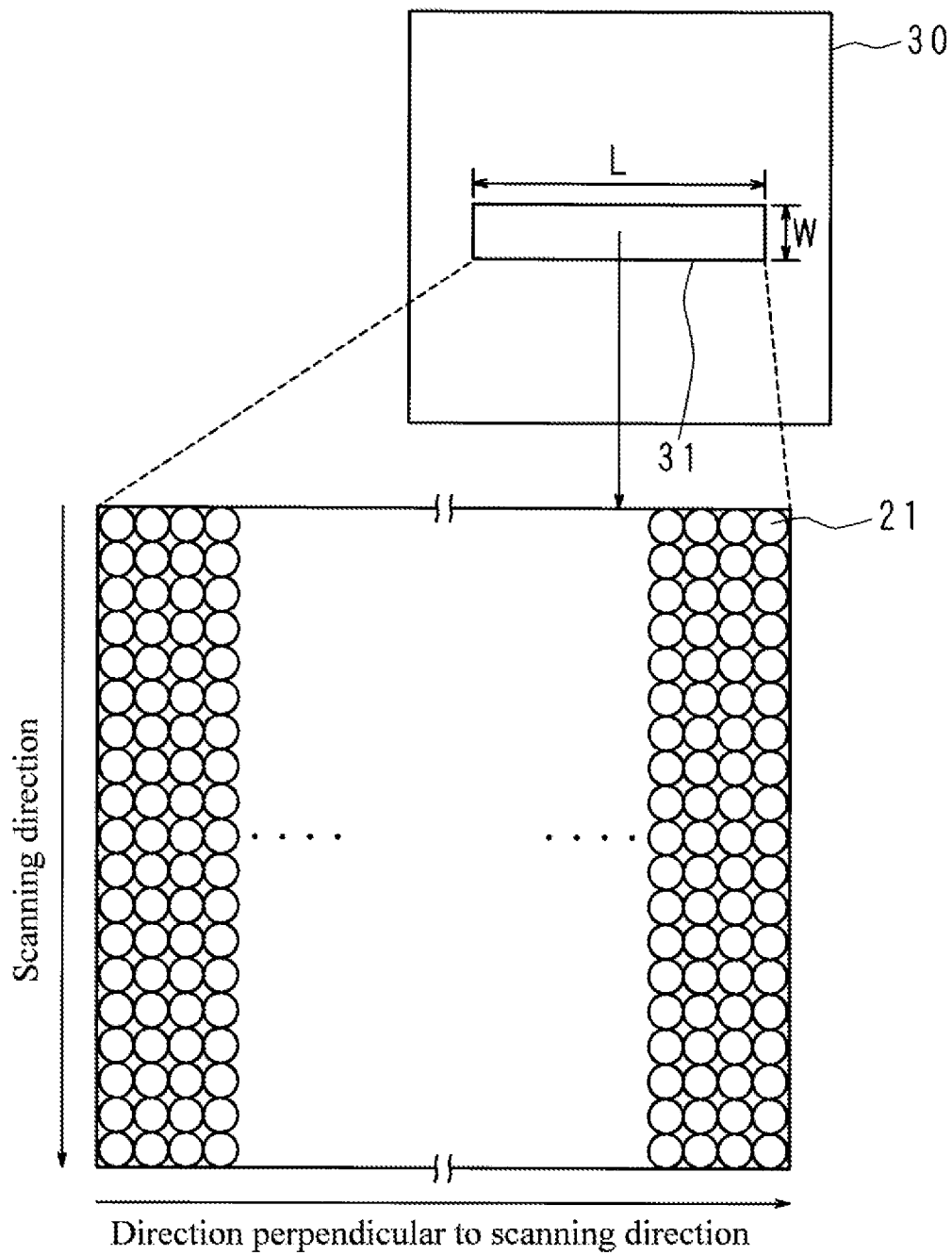
FIG. 2 is a schematic plan view of an example of configuration of a mask of the present embodiment.

FIG. 2 is a schematic plan view of an example of configuration of the mask 30 of the present embodiment. The mask 30 includes the mask portion 31 that has a rectangular shape. A dimension of the mask portion 31 in a scanning direction (lengthwise direction) is indicated by W and a dimension of the mask portion 31 in a direction perpendicular to the scanning direction (transverse direction) is indicated by L. The mask portion 31 includes microlenses 21 arranged in an array at constant intervals both in the scanning direction and in the direction perpendicular to the scanning direction. An opening, which will be described later, is formed to correspond to the center position of each microlens 21 in a plan view.

The dimension W of the mask portion 31 in the lengthwise direction can be set at approximately 5 mm for example and the dimension L of the mask portion 31 in the transverse direction can be set at approximately 37 mm for example. However, the respective dimensions are not limited to these values. The number of the microlenses 21 arranged at constant intervals in the scanning direction (lengthwise direction) is 20. Openings are formed in one-to-one correspondence with the microlenses 21. Accordingly, 20 openings are formed in the mask 30 at constant intervals in the scanning direction (lengthwise direction).

Figure 3:
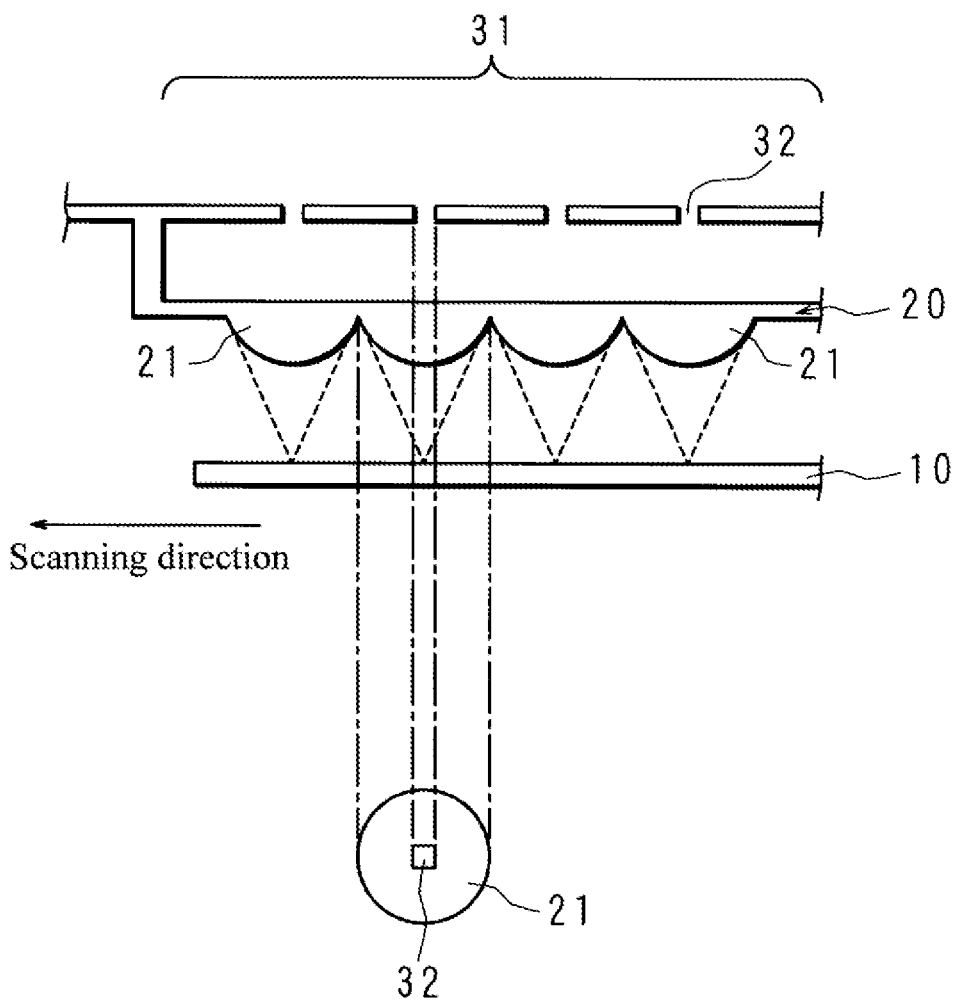
FIG. 3 is a schematic diagram illustrating positional relation between openings and microlenses of the present embodiment.

FIG. 3 is a schematic diagram illustrating positional relation between openings 32 and the microlenses 21 of the present embodiment. FIG. 3 illustrates the positional relation between the openings 32 and the microlenses 21 in a front view, as well as a position of an opening 32 relative to a position of a microlens 21 corresponding to the opening 32 in a plan view. In the present embodiment, the size of an opening 32 and the size of an irradiation pattern are described as being substantially equivalent to each other for simplification. However, the size of the opening 32 is actually larger than the size of the irradiation pattern since the laser light is converged by the microlens 21. As illustrated in FIG. 3, the mask portion 31 includes the plurality of openings 32 and the plurality of microlenses (lenses) 21. Note that the microlenses 21 are formed on a transparent substrate 20 to correspond to the respective openings 32. The transparent substrate 20 and the mask 30 are formed integrally with each other. Each of the openings 32, which is rectangular, is arranged to correspond to the center of a corresponding one of the microlenses 21, which is circular in a plan view. The mask 30 is set apart from incident surfaces of the microlenses 21 by an appropriate distance. The largest dimension of the microlens 21 (diameter of the circle in the plan view) can be set within a range from about 150 μm to about 400 μm for example, which values however should not be taken as specific limitations. The plurality of microlenses 21 may be collectively referred to as a microlens array.

When the openings 32 of the mask portion 31 are irradiated with parallel beams formed by the optical system 40 described above, laser light passed through the openings 32 are converged by the microlenses 21, and the substrate 10 is locally irradiated with the converged laser light in specific parts of the substrate 10 corresponding to the respective openings 32 (i.e., respective microlenses 21).

Figure 4A:
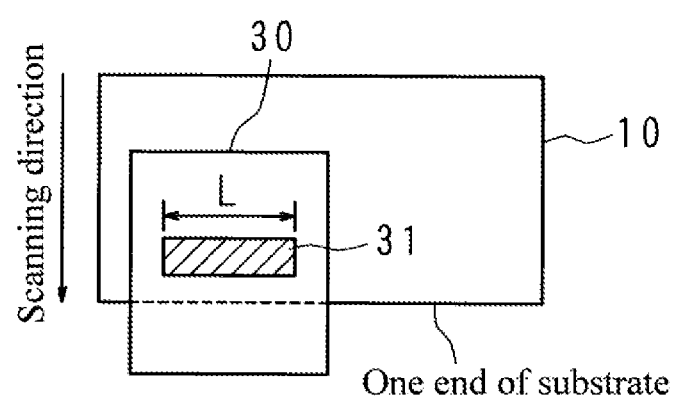
FIG. 4A is a schematic diagram illustrating an example of scanning of a substrate by the laser annealing device of the present embodiment.
Figure 4B:
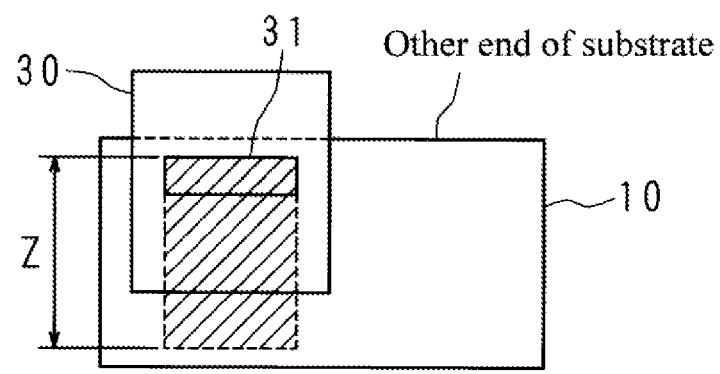
FIG. 4B is a schematic diagram illustrating the example of scanning of the substrate by the laser annealing device of the present embodiment.
Figure 4C:
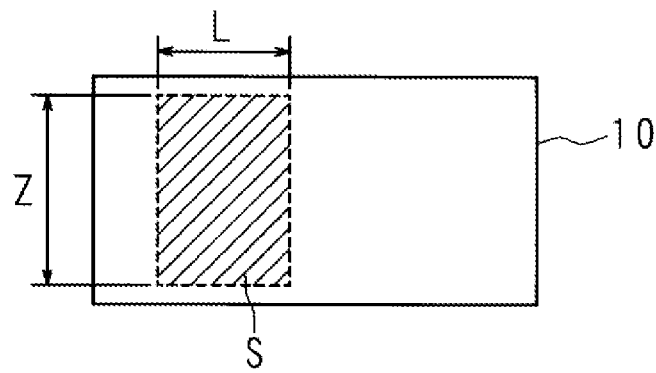
FIG. 4C is a schematic diagram illustrating the example of scanning of the substrate by the laser annealing device of the present embodiment.

FIGS. 4A, 4B, and 4C are schematic diagrams illustrating an example of scanning of the substrate 10 by the laser annealing device 100 of the present embodiment. FIG. 4A illustrates a state in which the mask 30 is set at a specific position before movement of the substrate 10 in the scanning direction is started. The substrate 10 is moved in the scanning direction at a constant speed from the state illustrated in FIG. 4A. The laser light source 50 irradiates the substrate 10 with laser light at time intervals at which a to-be-irradiated position of the substrate 10 reaches positions corresponding to the openings 32. For example, in a case where the openings 32 are provided as described with reference to FIG. 2, the same position of the substrate 10 is irradiated with the laser light 20 times. FIG. 4B illustrates a state in which the substrate 10 has been moved at the constant speed to a terminal position in the scanning direction (by a distance Z). By moving the substrate 10 to the state illustrated in FIG. 4B, the substrate 10 can be locally irradiated in specific parts within an irradiation area S of the substrate 10 with the laser light as illustrated in FIG. 4C. The irradiation area S can be expanded by moving the mask 30 by a distance L in the direction perpendicular to the scanning direction from the state illustrated in FIG. 4C and then moving the substrate 10 in the scanning direction in a manner similar to that illustrated in FIGS. 4A and 4B. Although the size of the substrate 10 and the size of the mask 30 are illustrated as being substantially equivalent to each other in FIGS. 4A and 4B, the size of the substrate 10 is actually considerably larger than that illustrated in FIGS. 4A and 4B.

Figure 5:
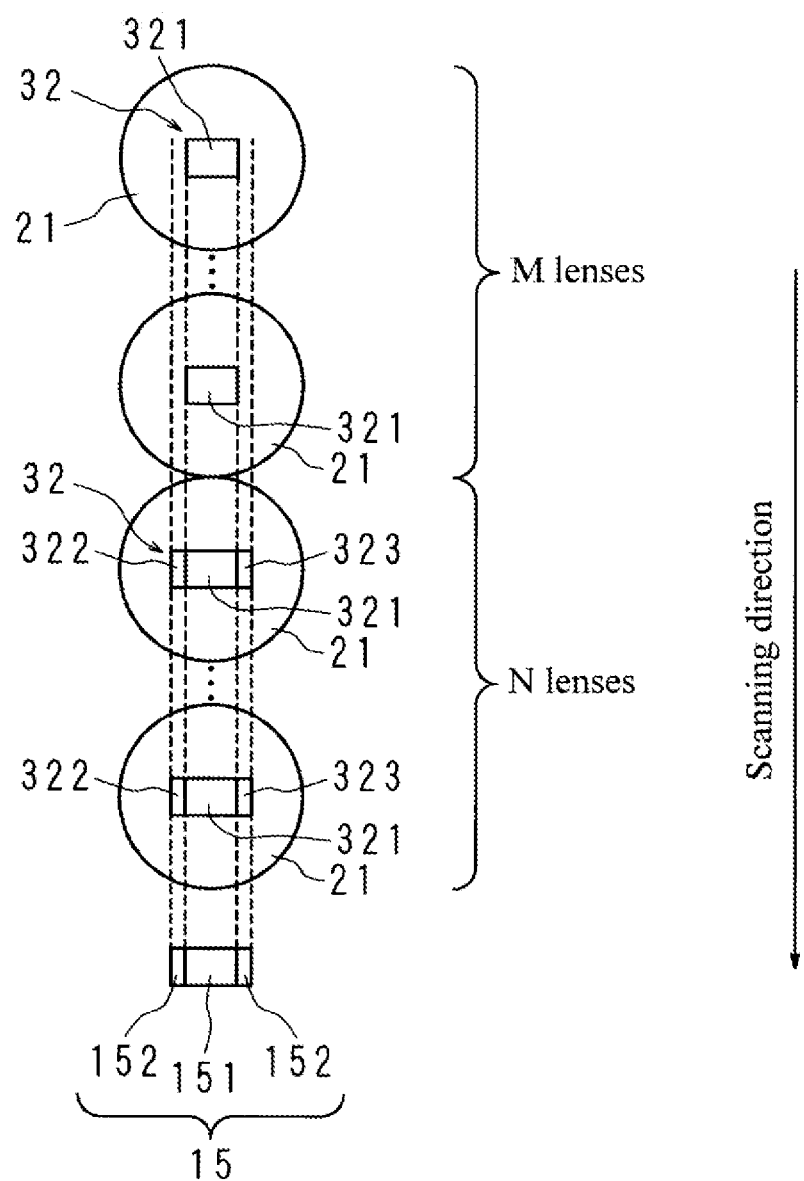
FIG. 5 is a schematic diagram illustrating a first example of openings of the mask of the present embodiment.

The following describes the openings 32 of the mask 30 of the present embodiment in detail. FIG. 5 is a schematic diagram illustrating a first example of the openings 32 of the mask 30 of the present embodiment. Note that in drawings described below, the openings 32 and the microlenses 21 are illustrated to indicate positional relation between the openings 32 and the microlenses 21 and only one row of the openings 32 and the microlenses 21 arranged in the scanning direction is illustrated for simplification of the drawings.

As illustrated in FIG. 5, the number of the openings 32 that are arranged at specific intervals in the scanning direction is represented by (M+N) in the first example. Each of the (M+N) openings 32 includes a first opening area 321. The respective first opening areas 321 of the (M+N) openings 32 have the same shape and are arranged in a line at constant intervals in the scanning direction. The first opening areas 321 have a rectangular shape and the center of each first opening area 321 corresponds to the center of a corresponding one of the microlenses 21.

Also, some openings 32 among the (M+N) openings 32 each include a second opening area 322 that is located in a specific direction with respect to the first opening area 321 and continuous with the first opening area 321. The number of the openings 32 each including the second opening area 322 is represented by N. The specific direction referred to in the following example is a direction perpendicular to the scanning direction. Note that the specific direction is not limited to the direction perpendicular to the scanning direction, and may be the scanning direction. In the example illustrated in FIG. 5, each of the N openings 32 includes paired second opening areas 322 and 322 that are located on respective opposite sides of the first opening area 321 in the direction perpendicular to the scanning direction and continuous with the first opening area 321.

In the first example, the same position of the substrate 10 is irradiated with laser light (N+M) times via the openings 32 each including the first opening area 321 and irradiated with laser light N times via the openings 32 each including both the first opening area 321 and the second opening area 322 in one cycle of scanning.

That is, the number of a plurality of openings 32 is (N+M) and the number of some openings 32 among the plurality of openings 32 is N. The substrate 10 is moved at a constant speed in the scanning direction. The laser light source 50 irradiates the substrate 10 with laser light at time intervals at which a to-be-irradiated position of the substrate 10 reaches positions corresponding to the openings 32. Therefore, the same position of the substrate 10 is irradiated with the laser light (N+M) times in one cycle of scanning. Since the openings 32 include the respective first opening areas 321 of the same shape arranged in a line at constant intervals in the scanning direction, a specific part of the substrate 10 corresponding to the first opening area 321 is irradiated with the laser light (N+M) times in one cycle of scanning. Also, a specific part of the substrate 10 corresponding to the second opening area 322 is irradiated with the laser light N times in one cycle of scanning.

A part 151 of the substrate 10 corresponding to the first opening area 321 is irradiated with a large amount of laser light, whereby high electron mobility can be achieved in the part 151 of the substrate 10. A part 152 of the substrate 10 corresponding to the second opening area 322, which is located in the specific direction with respect to the first opening area 321 and continuous with the first opening area 321, is irradiated with a small amount of laser light, whereby an amount of increase in electron mobility can be controlled so as not to become large in the part 152 of the substrate 10. Thus, annealing can be performed to achieve different degrees of electron mobility locally by one cycle of scanning, enabling formation of crystalline semiconductor films different from one another in electron mobility.

Also, some openings 32 among the plurality of openings 32 include the paired second opening areas 322 and 323 that are located on the respective opposite sides of the first opening area 321 in the specific direction and continuous with the first opening area 321. That is, the paired second opening areas 322 and 323 are arranged in the specific direction with the first opening area 321 interposed between the second opening areas 322 and 323. The above configuration enables for example formation of crystalline semiconductor films arranged in the specific direction in order of a crystalline semiconductor film having relatively high electron mobility formed in the part 152, a crystalline semiconductor film having high electron mobility formed in the part 151, and a crystalline semiconductor film having relatively high electron mobility formed in the part 152 by one cycle of scanning. In FIG. 5, the size of the opening 32 (the first opening area 321 and the second opening areas 322 and 323) and the size of an irradiation pattern (the parts 151 and 152 of the substrate 10 corresponding to the first opening area 321 and the second opening areas 322 and 323) are illustrated as being substantially equivalent to each other for simplification. However, the size of the opening 32 is actually larger than the size of the irradiation pattern since the laser light is converged by the microlens 21. This can also be said for FIG. 6 and the following drawings.

Figure 6:
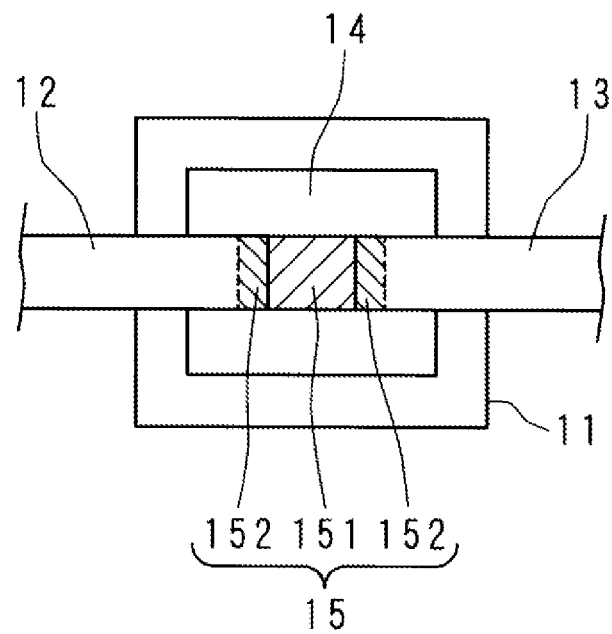
FIG. 6 is a schematic plan view of a main part of a thin film transistor subjected to annealing using the laser annealing device of the present embodiment.
Figure 7:
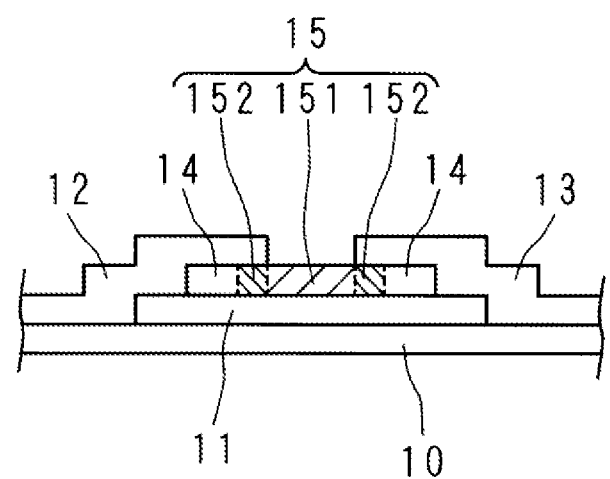
FIG. 7 is a schematic side view of the main part of the thin film transistor subjected to annealing using the laser annealing device of the present embodiment.

FIG. 6 is a schematic plan view of a main part of a thin film transistor subjected to annealing using the laser annealing device 100 of the present embodiment. FIG. 7 is a schematic side view of the main part of the thin film transistor subjected to annealing using the laser annealing device 100 of the present embodiment. Note that only the main part is illustrated in FIGS. 6 and 7 for simplification.

As illustrated in FIGS. 6 and 7, the thin film transistor subjected to annealing using the laser annealing device 100 of the present embodiment (thin film transistor of the present embodiment) includes: a gate electrode 11 disposed on a surface of the substrate 10; an amorphous semiconductor film 14 disposed above the gate electrode 11; a source electrode 12 disposed on the amorphous semiconductor film 14; a drain electrode 13 disposed on the amorphous semiconductor film 14; under-electrode crystalline semiconductor films 152 constituted by annealed portions of the amorphous semiconductor film 14 respectively located directly under a part of the source electrode 12 and a part of the drain electrode 13, which portions are annealed using the laser annealing device 100; and an inter-electrode crystalline semiconductor film 151 constituted by an annealed portion of the amorphous semiconductor film 14 located between the source electrode 12 and the drain electrode 13, which portion is annealed using the laser annealing device 199. The inter-electrode crystalline semiconductor film 151 has higher electron mobility than the under-electrode crystalline semiconductor films 152.

Figure 8:
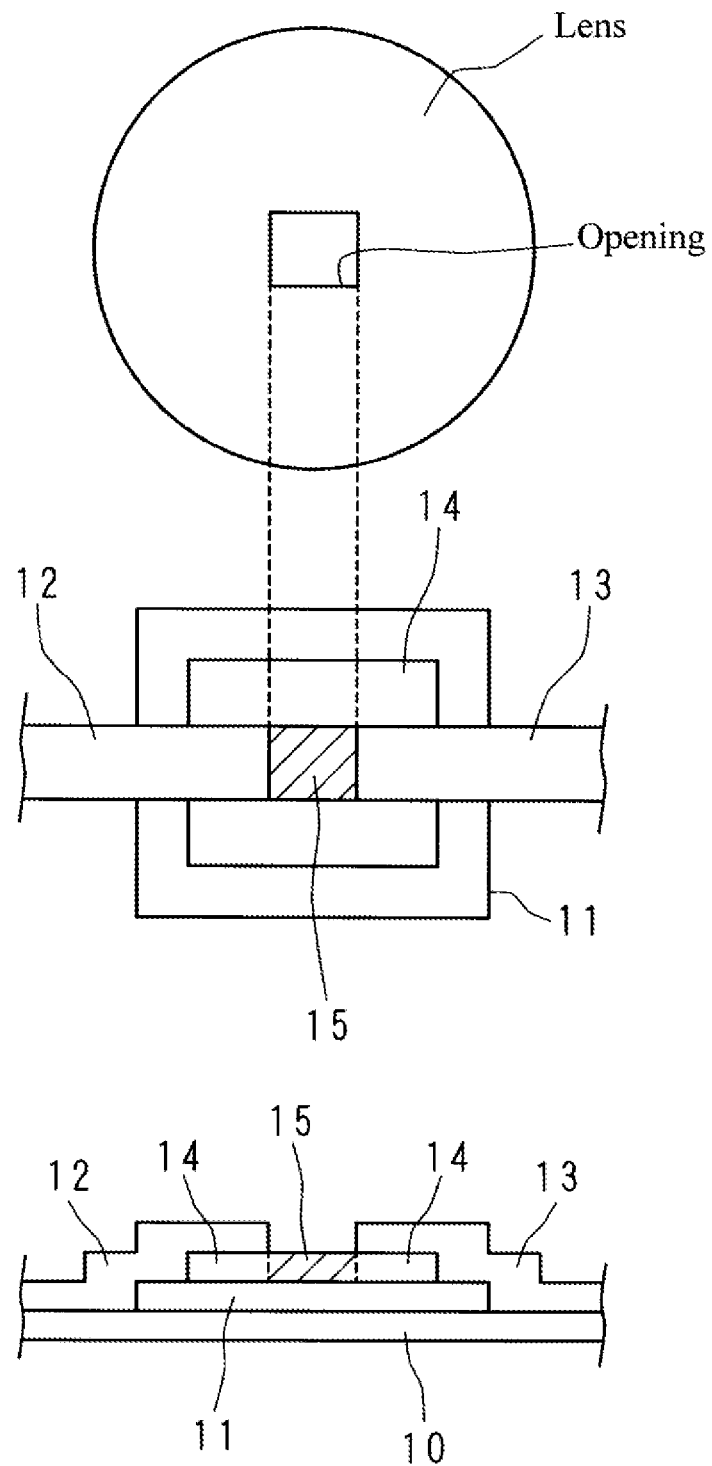
FIG. 8 is a schematic diagram illustrating a main part of an ideal thin film transistor subjected to annealing using a traditional laser annealing device.

The following describes a traditional case as a comparative example. FIG. 8 is a schematic diagram illustrating a main part of an ideal thin film transistor subjected to annealing using a traditional laser annealing device. An upper diagram in FIG. 8 illustrates an opening provided to correspond to a lens. Openings corresponding to respective lenses all have the same shape. A middle diagram in FIG. 8 illustrates the main part of the thin film transistor in a plan view. A lower diagram in FIG. 8 illustrates the main part of the thin film transistor in a side view. A part of the substrate corresponding to the opening is equivalent to a gap portion between the source electrode 12 and the drain electrode 13. Assuming that an ideal thin film transistor is produced, the gap portion between the source electrode 12 and the drain electrode 13 is formed of a crystalline semiconductor film 15 and regions respectively located directly under the source electrode 12 and the drain electrode 13 are formed of the amorphous semiconductor film 14, as illustrated in FIG. 8. The above configuration can reduce leakage current and increase drive current.

Figure 9:
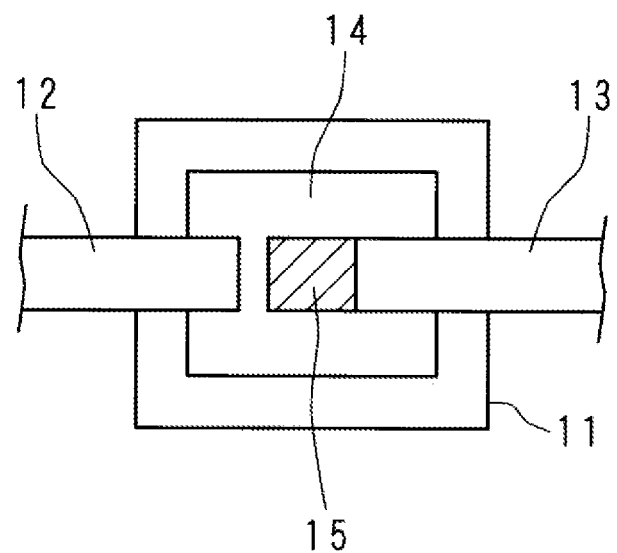
FIG. 9 is a schematic diagram illustrating a main part of an example of traditional thin film transistors.
Figure 9:
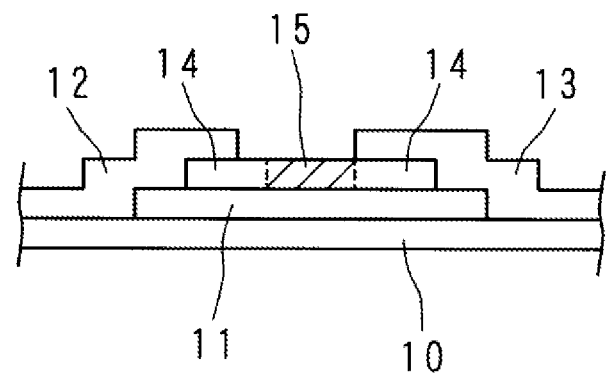

FIG. 9 is a schematic diagram illustrating a main part of an example of traditional thin film transistors. A mask included in a traditional laser annealing device includes openings all of which have the same shape. A part of the substrate corresponding to an opening constitutes a gap portion between the source electrode 12 and the drain electrode 13. If the substrate 10 deviates from the scanning direction while being conveyed in the scanning direction or an optical axis of laser light deviates for example, irradiation with the laser light may not be performed precisely on the gap portion. In such a case, a part of the gap portion is formed of the amorphous semiconductor film 14 as illustrated in FIG. 9. In a thin film transistor such as that illustrated in FIG. 9, the part of the gap portion has low electron mobility, resulting in failure to increase drive current.

Figure 10:
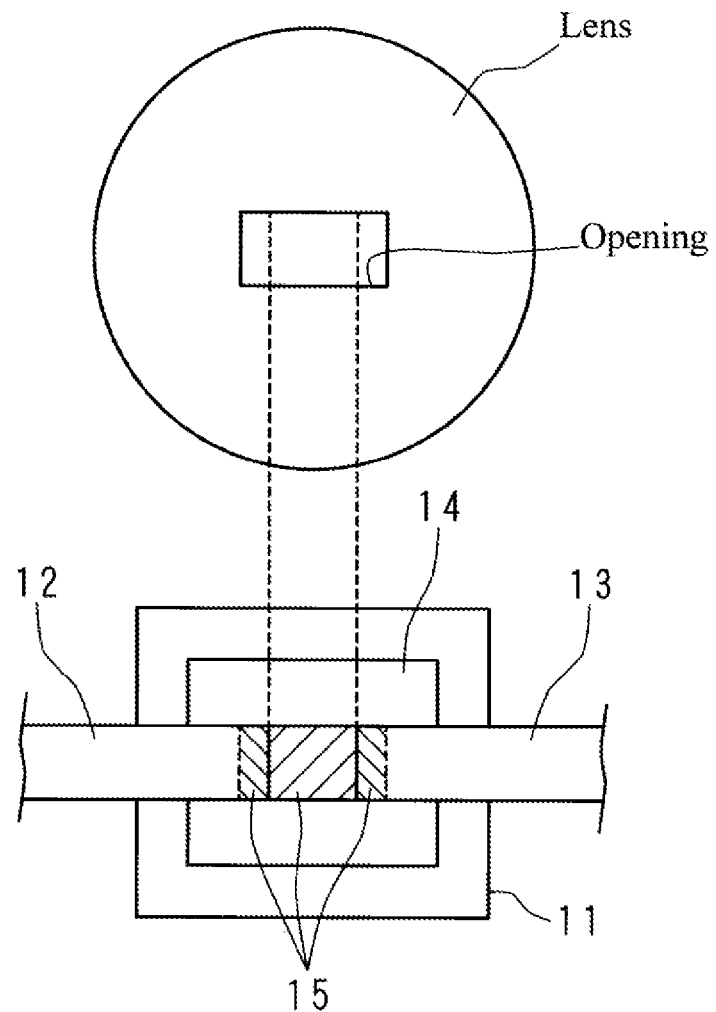
FIG. 10 is a schematic diagram illustrating a main part of another example of thin film transistors subjected to annealing using a traditional laser annealing device.
Figure 10:
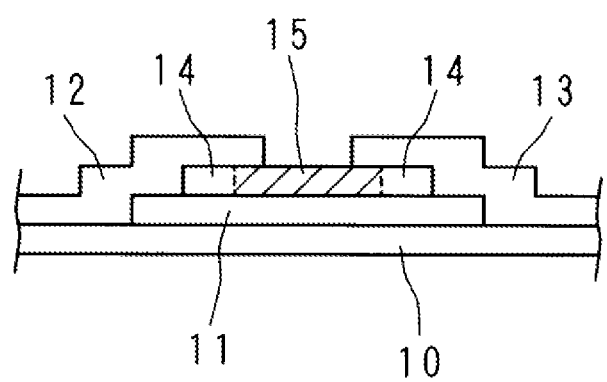

FIG. 10 is a schematic diagram illustrating a main part of another example of thin film transistors subjected to annealing using a traditional laser annealing device. An opening illustrated in FIG. 10 has a transverse dimension slightly larger than a transverse dimension of the opening illustrated in FIG. 8 so that a part of a region located directly under the source electrode 12 and a part of a region located directly under the drain electrode 13 are also irradiated with the laser light. The above configuration ensures that the gap portion between the source electrode 12 and the drain electrode 13 is formed of the crystalline semiconductor film 15 even if the substrate 10 deviates from the scanning direction while being conveyed in the scanning direction or the optical axis of the laser light deviates for example. However, the above configuration is disadvantageous in that leakage current increases since regions respectively located directly under a part of the source electrode 12 and a part of the drain electrode 13 are also formed of the crystalline semiconductor film 15.

By contrast, according to the present embodiment, the part 151 of the substrate 10 corresponding to the first opening area 321 is irradiated with a large amount of laser light, whereby high electron mobility can be achieved in the part 151 of the substrate 10. Also, the part 152 of the substrate 10 corresponding to the second opening area 322, which is located in the specific direction with respect to the first opening area 321 and continuous with the first opening area 321, is irradiated with a small amount of laser light, whereby an amount of increase in electron mobility can be controlled so as not to become large in the part 152 of the substrate 10, as described above. Thus, annealing can be performed to achieve different degrees of electron mobility locally by one cycle of scanning, enabling formation of crystalline semiconductor films different from one another in electron mobility.

Also, in the thin film transistor of the present embodiment, the gap portion between the source electrode 12 and the drain electrode 13 is constituted by a portion of the crystalline semiconductor film 15 having high electron mobility while regions respectively located directly under a part of the source electrode 12 and a part of the drain electrode 13 are constituted by portions of the crystalline semiconductor film 15 having relatively high electron mobility, as illustrated in FIGS. 6 and 7. In this configuration, reduction in leakage current and increase in drive current can both be achieved.

Figure 11:
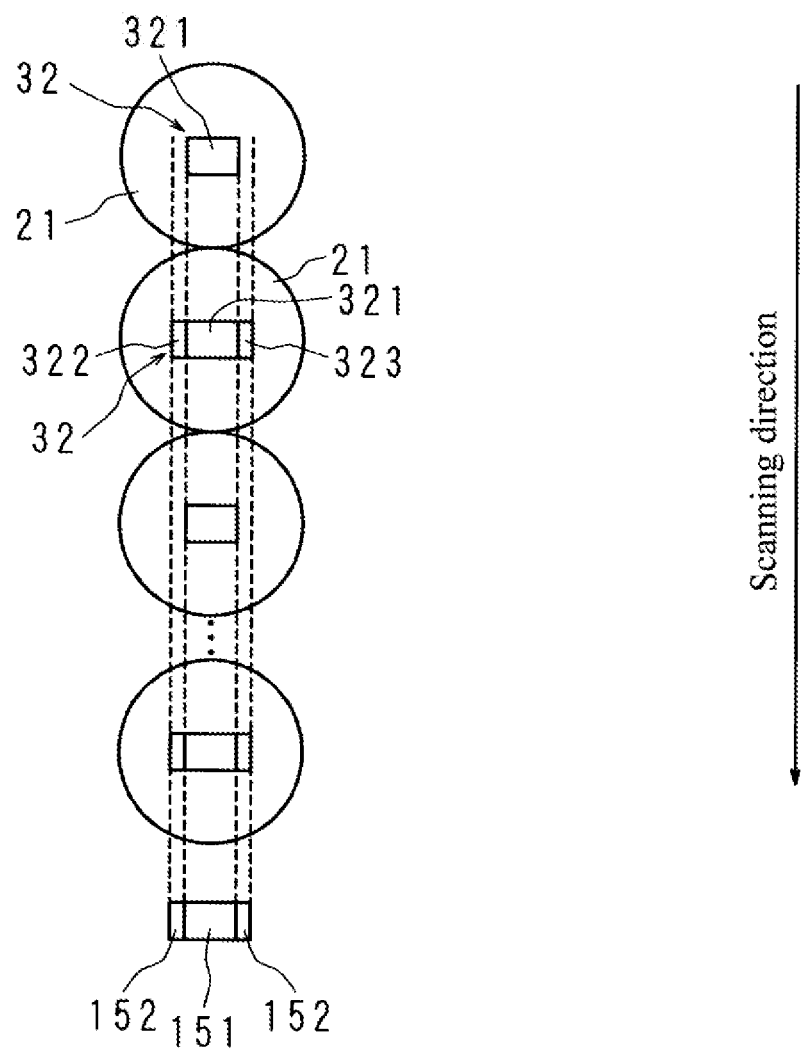
FIG. 11 is a schematic diagram illustrating a second example of the openings of the mask of the present embodiment.

FIG. 11 is a schematic diagram illustrating a second example of the openings 32 of the mask 30 of the present embodiment. The second example differs from the first example illustrated in FIG. 5 in that the openings 32 each including only the first opening area 321 and the openings 32 each including both the first opening area 321 and the second opening area 322 are alternately arranged in the scanning direction in the second example. Through this alternate arrangement, non-uniformity of incident light or unevenness due to deviation of the substrate 10 during conveyance or the like can be leveled out (made even). As a result, thin film transistors that are uniform in properties can be produced.

Figure 12:
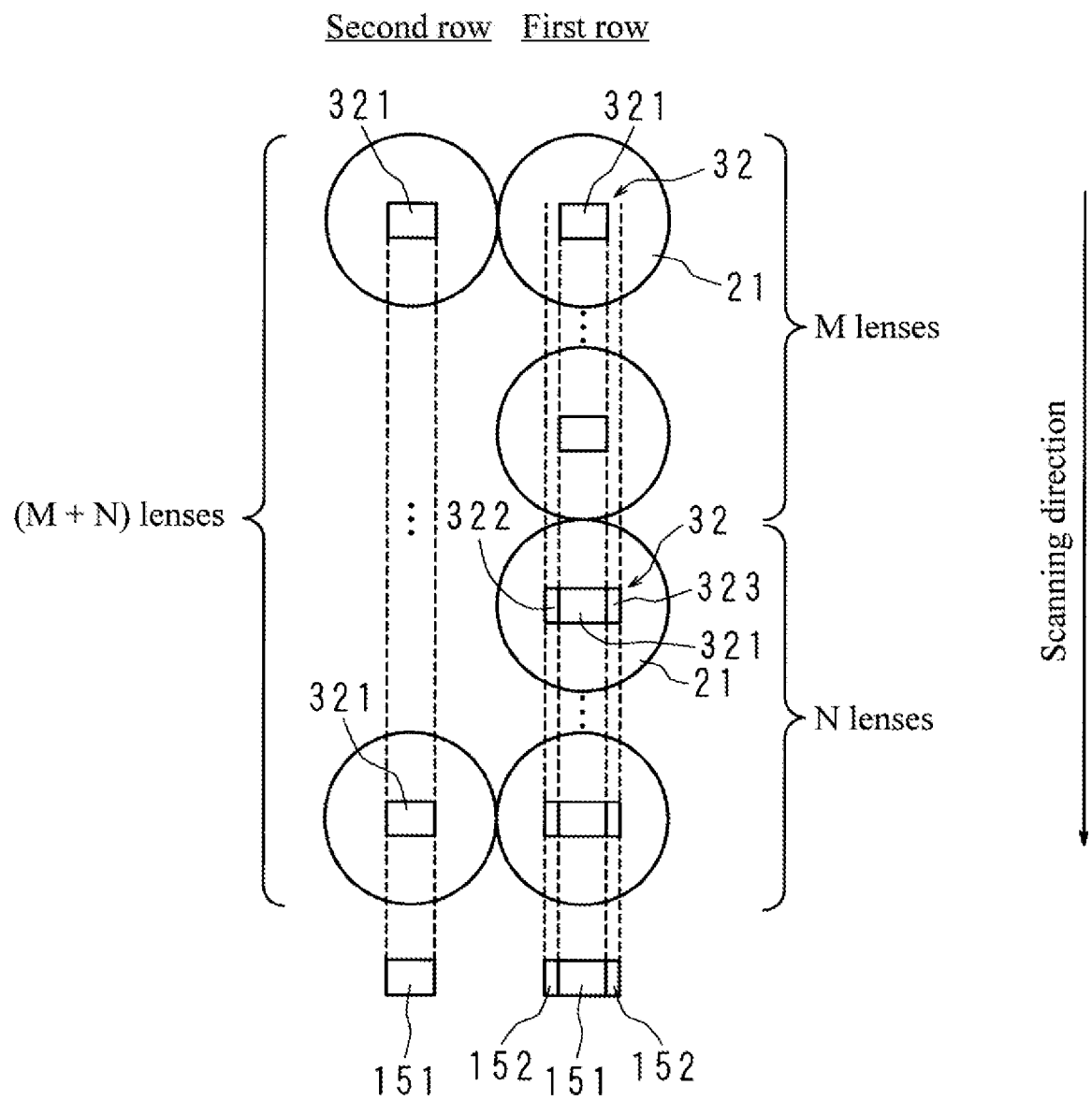
FIG. 12 is a schematic diagram illustrating a third example of the openings of the mask of the present embodiment.

FIG. 12 is a schematic diagram illustrating a third example of the openings 32 of the mask 30 of the present embodiment. The third example differs from the first example illustrated in FIG. 5 in that respective rows of the openings 32 arranged in the scanning direction include different types of the openings 32 in the third example. That is, the first row is constituted by the openings 32 that are similar to the openings 32 of the first example, while the second row is constituted by the (M+N) openings 32 each of which includes only the first opening area 321. This configuration enables formation of crystalline semiconductor films having different variations in electron mobility by one cycle of scanning.

Figure 13:
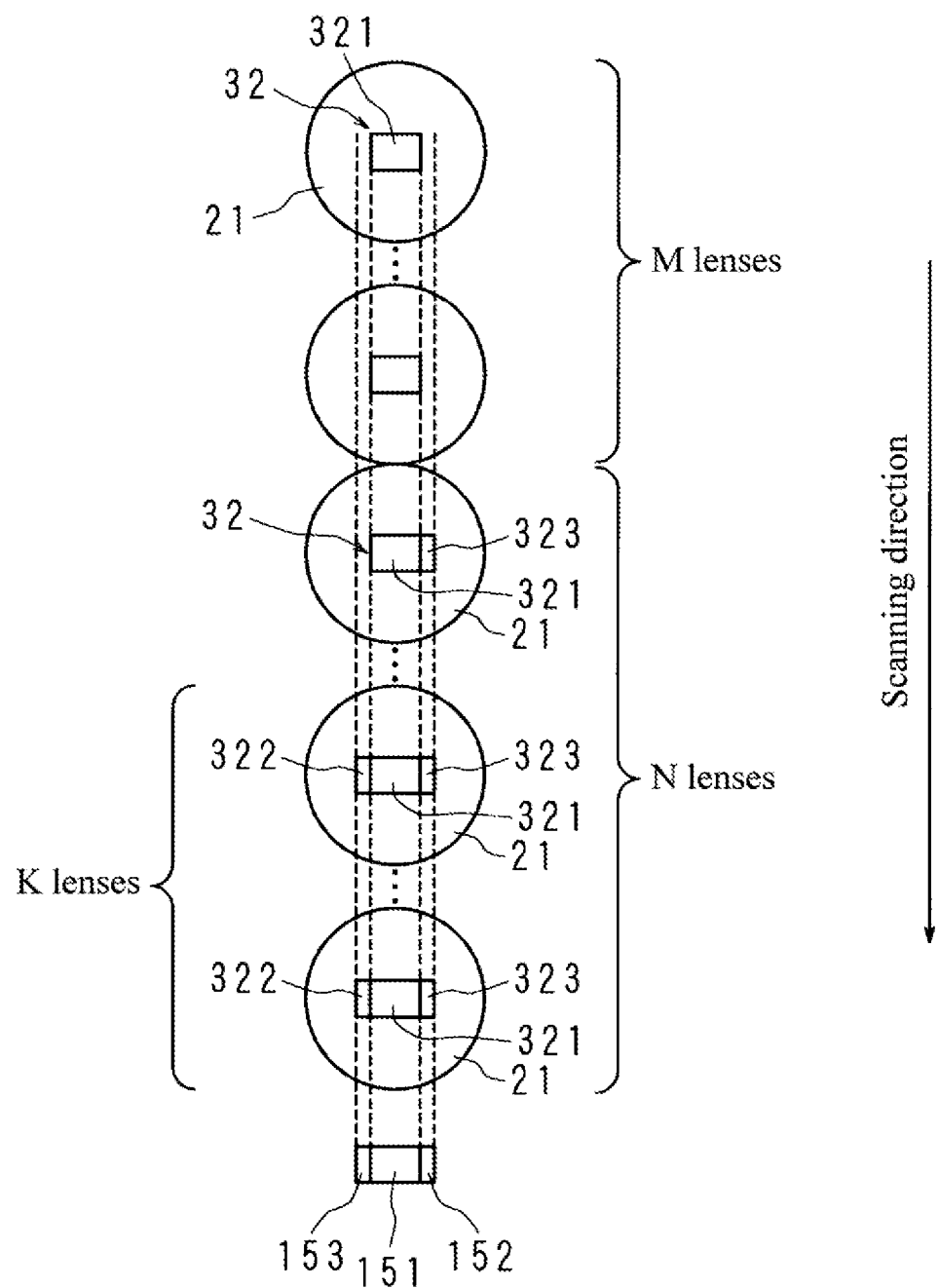
FIG. 13 is a schematic diagram illustrating a fourth example of the openings of the mask of the present embodiment.

FIG. 13 is a schematic diagram illustrating a fourth example of the openings 32 of the mask 30 of the present embodiment. In the fourth example, each of the (M+N) openings 32 includes the first opening area 321. The respective first opening areas 321 of the (M+N) openings 32 have the same shape and are arranged in a line at constant intervals in the scanning direction. The first opening areas 321 have a rectangular shape and the center of each first opening area 321 corresponds to the center of a corresponding one of the microlenses 21.

Also, some openings 32 among the (M+N) openings 32 each include the second opening area 323 that is located in a specific direction with respect to the first opening area 321 and continuous with the first opening area 321. The number of the openings 32 each including the second opening area 323 is represented by N. The specific direction is a direction perpendicular to the scanning direction. Further, some openings 32 among the N openings 32 each include the second opening area 322 located opposite to the second opening area 323 with the first opening area 321 interposed between the second opening areas 322 and 323. The number of the openings 32 each including the second opening area 322 is represented by K. In this configuration, the part 151 of the substrate corresponding to the first opening area 321 is irradiated with laser light (N+M) times. The part 152 of the substrate corresponding to the second opening area 323 is irradiated with laser light N times. A part 153 of the substrate corresponding to the second opening area 322 is irradiated with laser light K times. Through this configuration, crystalline semiconductor films different from one another in electron mobility can be formed at three positions by one cycle of scanning.

Figure 14:
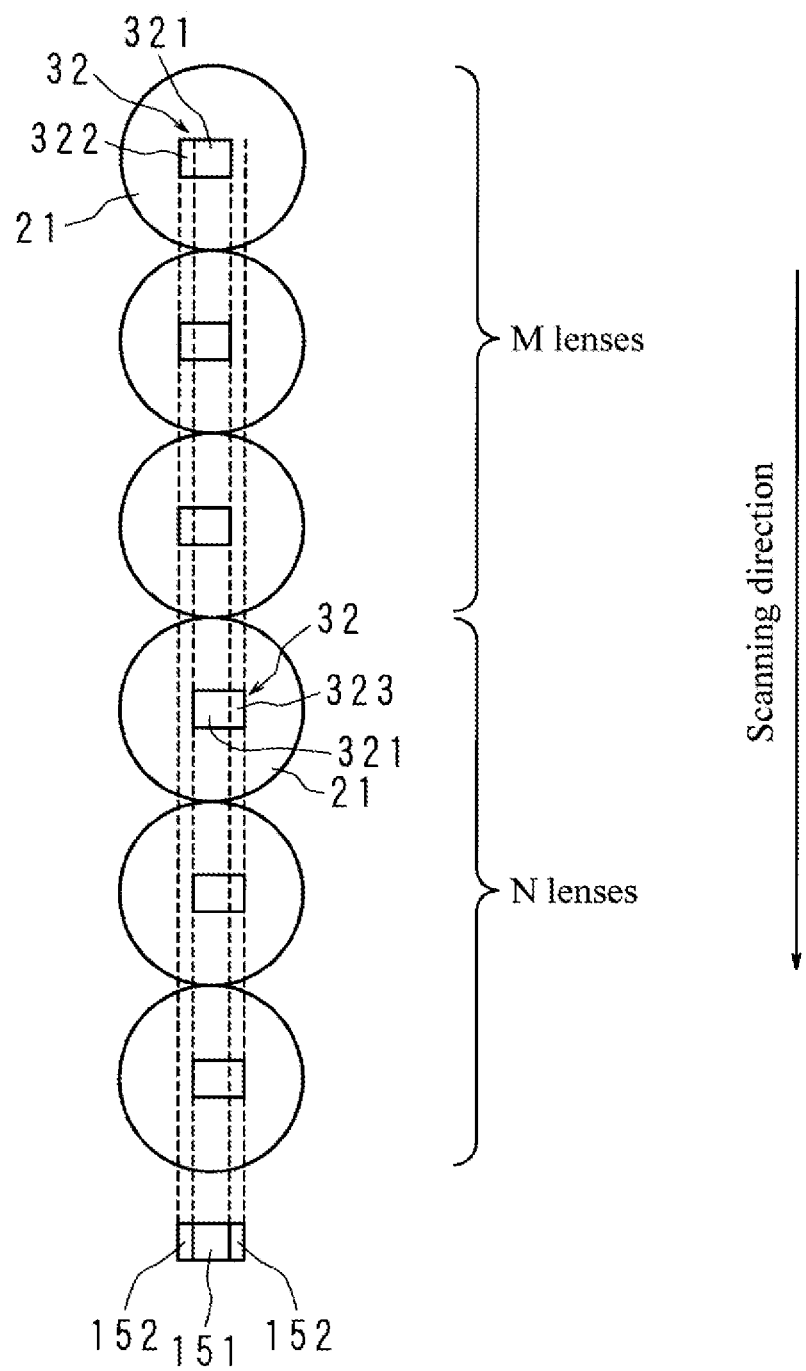
FIG. 14 is a schematic diagram illustrating a fifth example of the openings of the mask of the present embodiment.

FIG. 14 is a schematic diagram illustrating a fifth example of the openings 32 of the mask 30 of the present embodiment. In the fifth example, each of the (M+N) openings 32 includes the first opening area 321. The respective first opening areas 321 of the (M+N) openings 32 have the same shape and are arranged in a line at constant intervals in the scanning direction. The first opening areas 321 have a rectangular shape and the center of each first opening area 321 corresponds to the center of a corresponding one of the microlenses 21.

Also, some openings 32 among the (M+N) openings 32 each include the second opening area 322 that is located in a specific direction with respect to the first opening area 321 and continuous with the first opening area 321. The number of the openings 32 each including the second opening area 322 is represented by M. The specific direction is a direction perpendicular to the scanning direction. In the example illustrated in FIG. 14, the second opening area 322 is located on the left of the first opening area 321. Also, some openings 32 among the (M+N) openings 32 each include the second opening area 323 that is located in a specific direction with respect to the first opening area 321 and continuous with the first opening area 321. The number of the openings 32 each including the second opening area 323 is represented by N. In the example illustrated in FIG. 14, the second opening area 323 is located on the right of the first opening area 321. In the example illustrated in FIG. 14, the (M+N) openings 32 have the same shape and the same size. The positions of the M openings 32 are displaced from the center to the left. The positions of the N openings 32 are displaced from the center to the right.

In the above configuration, the part 151 of the substrate corresponding to the first opening area 321 is irradiated with laser light (M+N) times. The part 152 of the substrate corresponding to the second opening area 322 is irradiated with laser light M times. The part 152 of the substrate corresponding to the second opening area 323 is irradiated with laser light N times. Through the above, crystalline semiconductor films different from one another in electron mobility can be formed by one cycle of scanning.

In the first through fifth examples described above, the specific direction is a direction perpendicular to the scanning direction, and respective dimensions of the first opening area 321 and the second opening areas 322 and 323 in the scanning direction are substantially equivalent to one another. As a result, crystalline semiconductor films having substantially equivalent dimensions in the scanning direction and differing from one another in electron mobility can be formed so as to be arranged in the direction perpendicular to the scanning direction in order of a crystalline semiconductor film having relatively high electron mobility, a crystalline semiconductor film having high electron mobility, and a crystalline semiconductor film having relatively high electron mobility.

Figure 15:
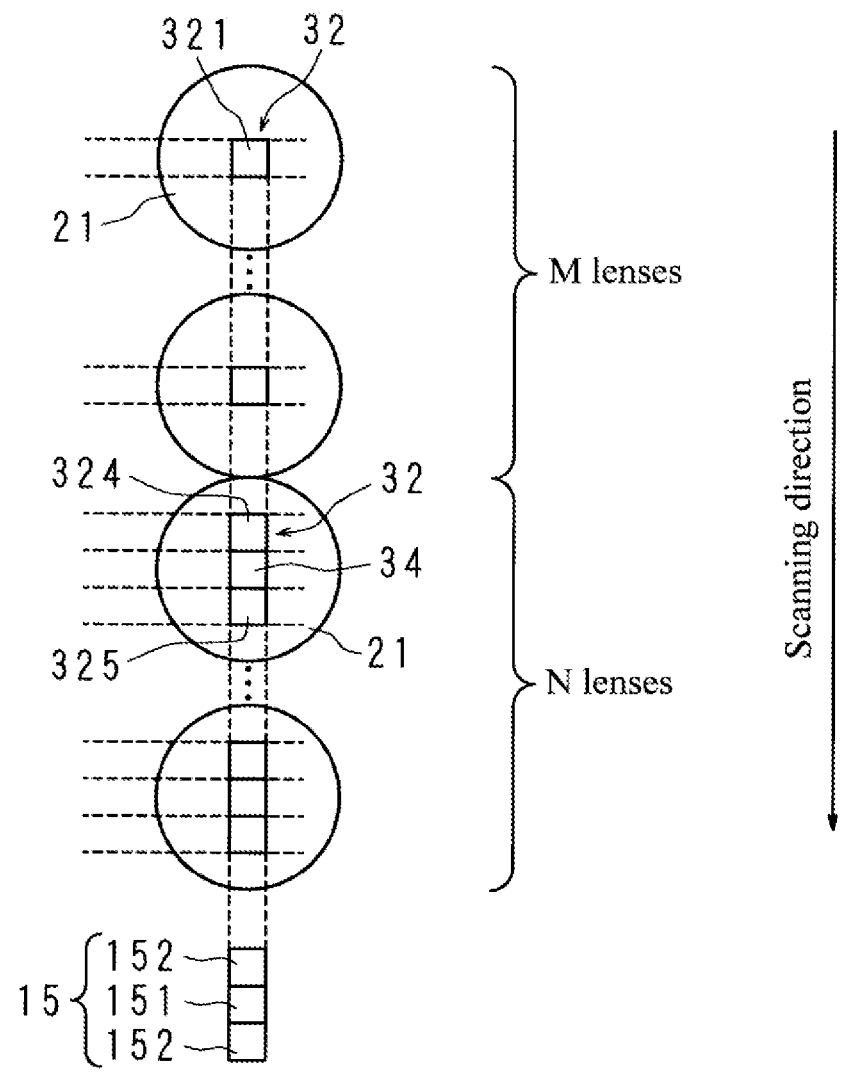
FIG. 15 is a schematic diagram illustrating a sixth example of the openings of the mask of the present embodiment.

The following describes cases where the specific direction is the scanning direction. FIG. 15 is a schematic diagram illustrating a sixth example of the openings 32 of the mask 30 of the present embodiment. In the sixth example, each of the (M+N) openings 32 includes the first opening area 321. The respective first opening areas 321 of the (M+N) openings 32 have the same shape and are arranged in a line at constant intervals in the scanning direction. The first opening areas 321 have a rectangular shape and the center of each first opening area 321 corresponds to the center of a corresponding one of the microlenses 21.

Also, some openings 32 among the (M+N) openings 32 each include paired second opening areas 324 and 325 that are located on respective opposite sides of the first opening area 321 in the scanning direction and continuous with the first opening area 321. The number of the openings 32 each including the paired second opening areas 324 and 325 is represented by N. That is, each of the N openings 32 includes the paired second opening areas 324 and 325 arranged in the scanning direction with the first opening area 321 interposed between the second opening areas 324 and 325.

The part 151 of the substrate 10 corresponding to the first opening area 321 is irradiated with a large amount of laser light, whereby high electron mobility can be achieved in the part 151 of the substrate 10. Parts 152 of the substrate 10 respectively corresponding to the second opening areas 324 and 325 are irradiated with a small amount of laser light, whereby an amount of increase in electron mobility can be controlled so as not to become large in the parts 152 of the substrate 10. Thus, annealing can be performed to achieve different degrees of electron mobility locally by one cycle of scanning, enabling formation of crystalline semiconductor films different from one another in electron mobility.

Also, the above enables formation of crystalline semiconductor films arranged in the scanning direction in order of a crystalline semiconductor film having relatively high electron mobility formed in the part 152, a crystalline semiconductor film having high electron mobility formed in the part 151, and a crystalline semiconductor film having relatively high electron mobility formed in the part 152.

Figure 16:
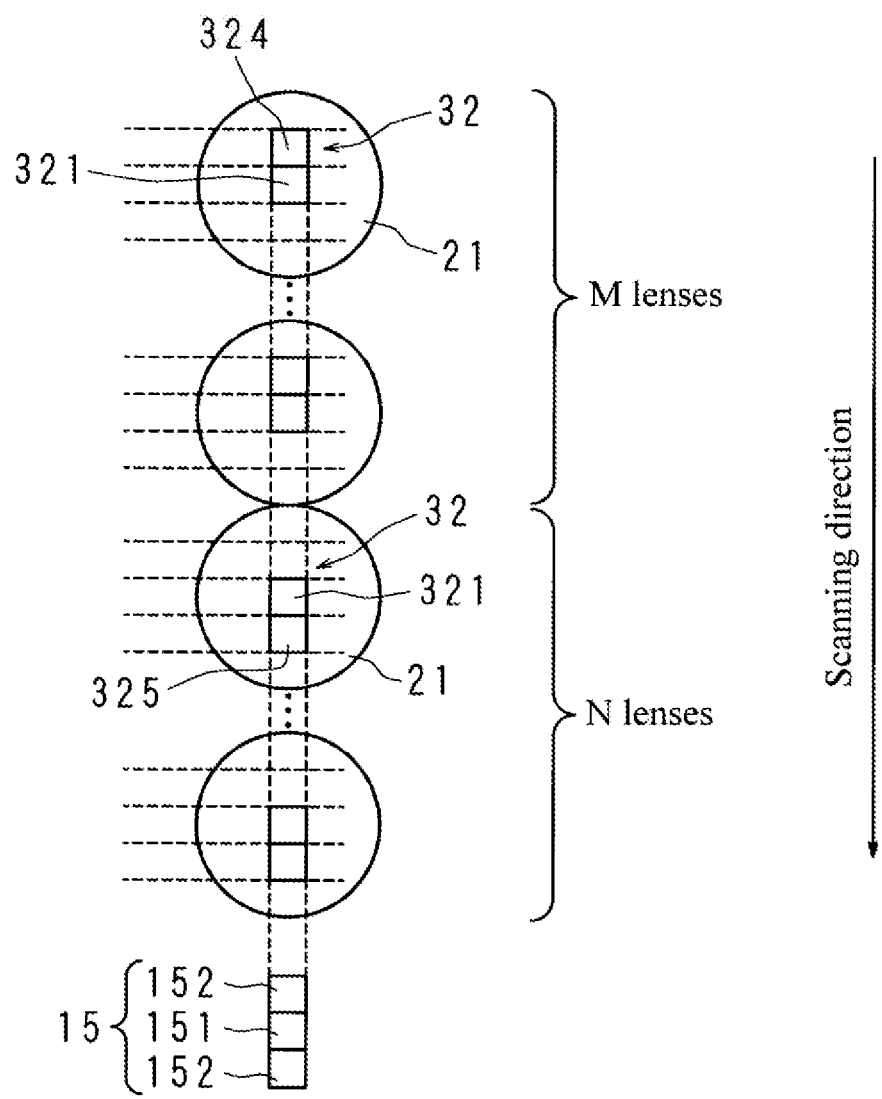
FIG. 16 is a schematic diagram illustrating a seventh example of the openings of the mask of the present embodiment.

FIG. 16 is a schematic diagram illustrating a seventh example of the openings 32 of the mask 30 of the present embodiment. In the seventh example, each of the (M+N) openings 32 includes the first opening area 321. The respective first opening areas 321 of the (M+N) openings 32 have the same shape and are arranged in a line at constant intervals in the scanning direction. The first opening areas 321 have a rectangular shape and the center of each first opening area 321 corresponds to the center of a corresponding one of the microlenses 21.

Also, some openings 32 among the (M+N) openings 32 each include the second opening area 324 that is located in the scanning direction with respect to the first opening area 321 and continuous with the first opening area 321. The number of the openings 32 each including the second opening area 324 is represented by M. In the example illustrated in FIG. 16, the second opening area 324 is located above the first opening area 321. Also, some openings 32 among the (M+N) openings 32 each include the second opening area 325 that is located in the scanning direction with respect to the first opening area 321 and continuous with the first opening area 321. The number of the openings 32 each including the second opening area 325 is represented by N. In the example illustrated in FIG. 16, the second opening area 325 is located below the first opening area 321. In the example illustrated in FIG. 16, the (M+N) openings 32 have the same shape and the same size. The positions of the M openings 32 are displaced from the center to the upper side (rearward in the scanning direction). The positions of the N openings 32 are displaced from the center to the lower side (forward in the scanning direction).

In the above configuration, the part 151 of the substrate corresponding to the first opening area 321 is irradiated with laser light (M+N) times. The part 152 of the substrate corresponding to the second opening area 324 is irradiated with laser light M times. The part 152 of the substrate corresponding to the second opening area 325 is irradiated with laser light N times. Through the above, crystalline semiconductor films different from one another in electron mobility can be formed by one cycle of scanning.

As described above, the specific direction is the scanning direction and respective dimensions of the first opening area 321 and the second opening areas 324 and 325 in the direction perpendicular to the scanning direction are substantially equivalent to one another in the sixth and seventh examples. As a result, crystalline semiconductor films having substantially equivalent dimensions in the direction perpendicular to the scanning direction and differing from one another in electron mobility can be formed so as to be arranged in the scanning direction in order of a crystalline semiconductor film having relatively high electron mobility, a crystalline semiconductor film having high electron mobility, and a crystalline semiconductor film having relatively high electron mobility.

Also, the first opening area 321 in each of the above examples has a rectangular shape. Since the first opening area 321 has the rectangular shape, the part of the substrate corresponding to the first opening area 321 can constitute a gap portion between the source electrode 12 and the drain electrode 13. Also, the second opening areas 322, 323, 324, and 325, each of which is continuous with the first opening area 321, can constitute under-electrode regions each located directly under a part of the source electrode 12 or a part of the drain electrode 13.

Also, the laser annealing device 100 of the present embodiment includes the microlenses 21 that converge laser light. Therefore, the laser annealing device 100 is capable of performing local laser annealing by locally irradiating the substrate in specific parts of the substrate with laser light. Also, the laser annealing device 100 of the present embodiment includes the laser light source 50. Therefore, the laser annealing device 100 is capable of performing local laser annealing.

Figure 17:
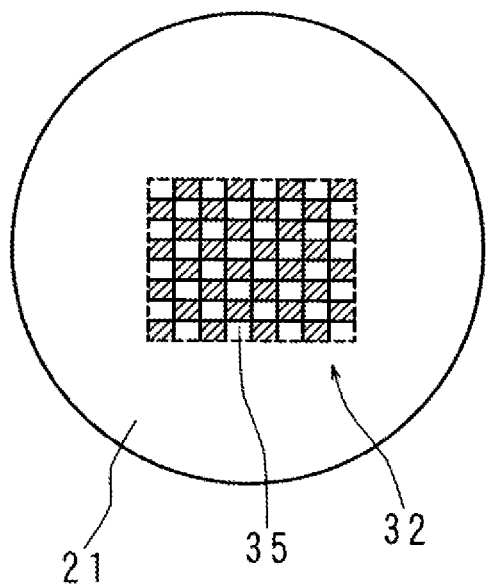
FIG. 17 is a schematic diagram illustrating an eighth example of the openings of the mask of the present embodiment.
Figure 17:
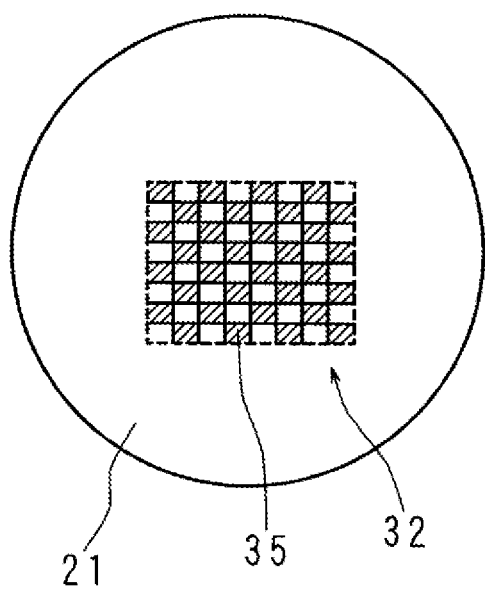

FIG. 17 is a schematic diagram illustrating an eighth example of the openings 32 of the mask 30 of the present embodiment. As illustrated in FIG. 17, the openings 32 are provided with adjustment members 35 in the form of tiny rectangles arranged in a grid pattern. The adjustment members 35 adjust an irradiation amount of laser light. The adjustment members 35 are formed of a material appropriately selected from materials that reduce an amount of transmittance of the laser light. In pattern B, openings are provided at positions of the adjustment members 35 in pattern A, and the adjustment members 35 are provided at positions of openings in pattern A. By arranging the adjustment members 35 that adjust the irradiation amount of laser light in complementary positions as illustrated in patterns A and B, non-uniformity of the irradiation amount of laser light can be eliminated to make the irradiation amount uniform. Also, it is possible to adjust an irradiation amount of laser light with which a specific part of the substrate 10 is irradiated in one cycle of scanning to adjust electron mobility of a crystalline semiconductor layer to a specific value.

Figure 18:
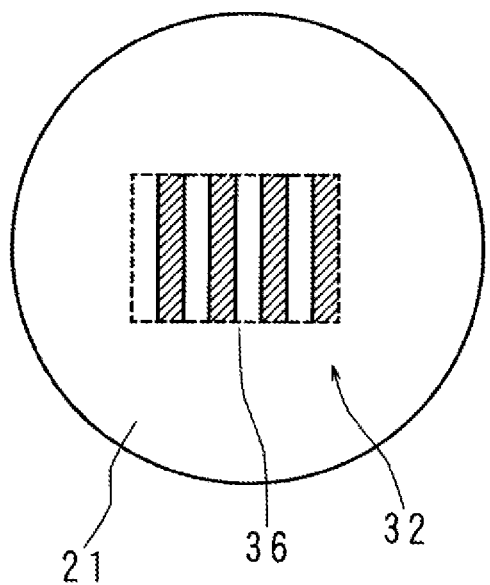
FIG. 18 is a schematic diagram illustrating a ninth example of the openings of the mask of the present embodiment.
Figure 18:
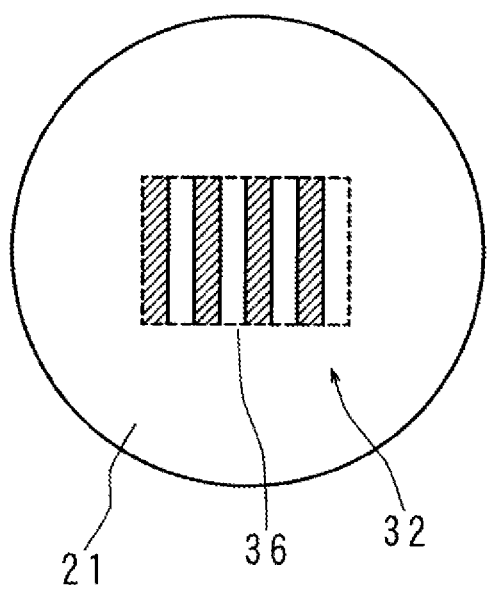

FIG. 18 is a schematic diagram illustrating a ninth example of the openings 32 of the mask 30 of the present embodiment. As illustrated in FIG. 18, the openings 32 are provided with adjustment members 36 in the form of tiny rectangles arranged in a slit-like pattern. In pattern D, openings are provided at positions of the adjustment members 36 in pattern C, and the adjustment members 36 are provided at positions of openings in pattern C. By arranging the adjustment members 36 that adjust the irradiation amount of laser light in complementary positions as illustrated in patterns C and D, non-uniformity of the irradiation amount of laser light can be eliminated to make the irradiation amount uniform. Also, it is possible to adjust an irradiation amount of laser light with which a specific part of the substrate 10 is irradiated in one cycle of scanning to adjust electron mobility of a crystalline semiconductor layer to a specific value.

The openings 32 such as those illustrated in FIGS. 17 and 18 may be applied to the openings 32 each including only the first opening area 321 or to the openings 32 each including both the first opening area 321 and the second opening area 322, 323, 324, or 325. Also, the openings 32 such as those illustrated in FIGS. 17 and 18 may be applied to both the first opening area 321 and the second opening area 322, 323, 324, or 325. Alternatively, the openings 32 such as those illustrated in FIGS. 17 and 18 may be applied to the first opening area 321 only or to the second opening area 322, 323, 324, or 325 only.

Figure 19:
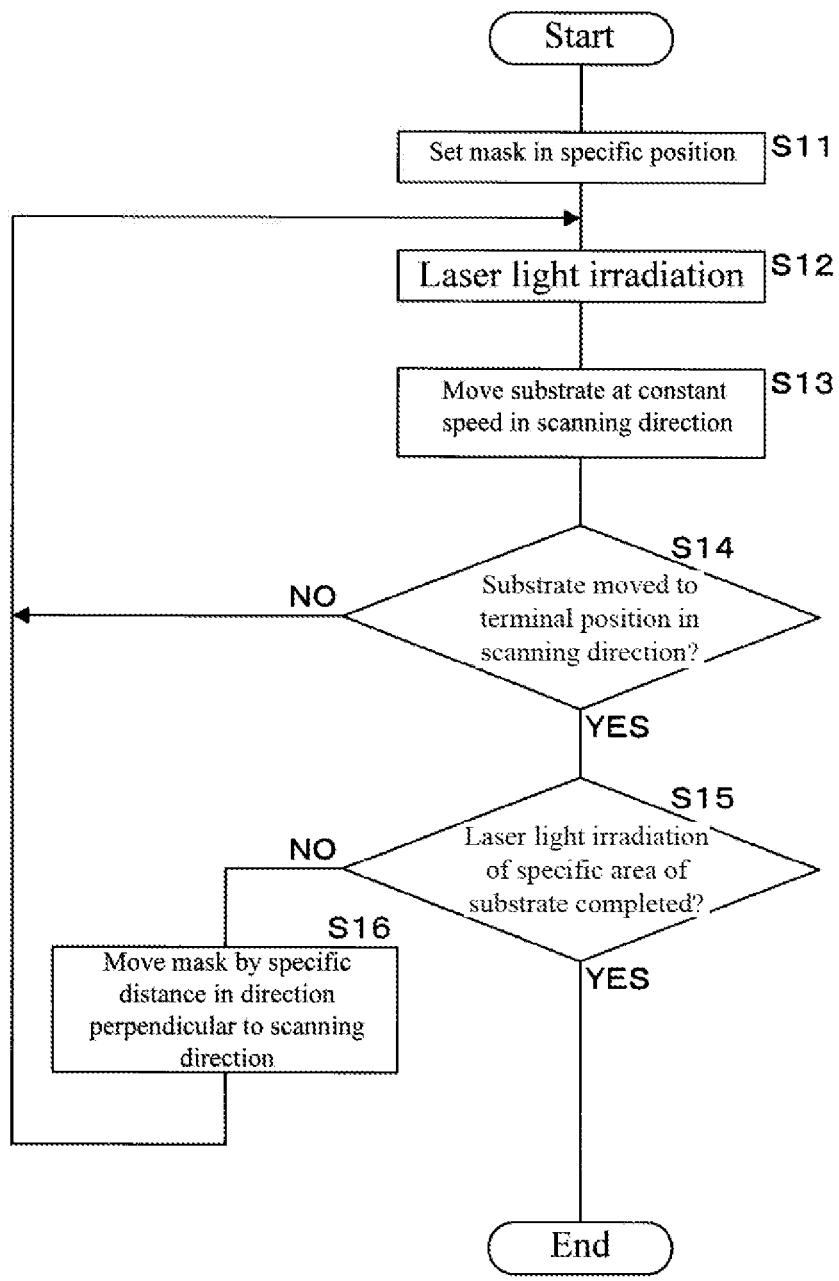
FIG. 19 is a flowchart illustrating an example of laser annealing methods using the laser annealing device of the present embodiment.

The following describes a laser annealing method using the laser annealing device 100 of the present embodiment. FIG. 19 is a flowchart illustrating an example of laser annealing methods using the laser annealing device 100 of the present embodiment. In the following description, the laser annealing device 100 will be referred to as the device 100 for simplification. The device 100 sets the mask 30 at a specific position (Step S11) and performs irradiation with laser light (Step S12). The device 100 moves the substrate 10 at a constant speed in the scanning direction (Step S13). The laser light source 50 irradiates the substrate 10 with the laser light at time intervals at which a to-be-irradiated position of the substrate 10 reaches positions corresponding to the openings 32 of the mask 30.

The device 100 determines whether or not the substrate 10 is moved to a terminal position in the scanning direction (Step S14). When the substrate 10 is not moved to the terminal position (NO at Step S14), the device 100 repeats the routine from Step S12. When the substrate 10 is moved to the terminal position in the scanning direction (YES at Step S14), the device 100 determines whether or not irradiation of a specific area of the substrate 10 with the laser light is completed (Step S15).

When irradiation of the specific area of the substrate 10 with the laser light is not completed (NO at Step S15), the device 100 moves the mask 30 by a prescribed distance (transverse dimension L of the mask 30) in a direction perpendicular to the scanning direction (Step S16), and repeats the routine from Step S12. When irradiation of the specific area of the substrate 10 with the laser light is completed (YES at Step S15), the device 100 ends the processing. Although the substrate 10 is moved (conveyed) in the scanning direction in the example described with reference to FIG. 19, the present invention is not limited to this configuration. The mask 30 (optionally including the optical system 40) may be moved in the scanning direction while the substrate 10 is fixed.

The openings 32 have a rectangular shape in the embodiment described above. However, the shape of the openings 32 is not limited to the rectangular shape, and may be an elliptical shape, for example. Also, circular or rectangular cutouts may be formed at four corners of the rectangular opening 32. In this configuration, an irradiation amount of laser light can be slightly increased in the vicinities of the four corners of the opening 32 so that a region irradiated with the laser light has a rectangular shape.

The present embodiment is applicable not only to TFTs using a silicon semiconductor but also to TFTs using an oxide semiconductor to perform annealing that achieves different degrees of electron mobility locally by one cycle of scanning.

Features described above in the respective examples may be combined to produce a new technical feature through the combination.

A laser annealing device according to an embodiment of the present invention includes a mask having a plurality of openings arranged in a scanning direction. The laser annealing device irradiates a substrate with laser light via the openings. Each of the plurality of openings includes a first opening area. The respective first opening areas have the same shape and are arranged in a line in the scanning direction. At least one opening among the plurality of openings includes a second opening area that is located in a specific direction with respect to the first opening area and continuous with the first opening area.

A mask according to an embodiment of the present invention has a plurality of openings arranged in a scanning direction of a substrate. Each of the plurality of openings includes a first opening area. The respective first opening areas have the same shape and are arranged in a line in the scanning direction. At least one opening among the plurality of openings includes a second opening area that is located in a specific direction with respect to the first opening area and continuous with the first opening area.

A thin film transistor according to an embodiment of the present invention includes: a gate electrode disposed on a surface of a substrate; an amorphous semiconductor film disposed above the gate electrode; a source electrode disposed on the amorphous semiconductor film; a drain electrode disposed on the amorphous semiconductor film; under-electrode crystalline semiconductor films constituted by annealed portions of the amorphous semiconductor film respectively located directly under a part of the source electrode and a part of the drain electrode, which portions being annealed using the laser annealing device of the above embodiment; and an inter-electrode crystalline semiconductor film constituted by an annealed portion of the amorphous semiconductor film located between the source electrode and the drain electrode, which portion being annealed using the laser annealing device of the above embodiment. The inter-electrode crystalline semiconductor film has higher electron mobility than the under-electrode crystalline semiconductor films.

A laser annealing method according to an embodiment of the present invention uses the laser annealing device according to any of the above embodiments. The laser annealing method includes moving a position of one of a substrate and a mask relative to a position of the other of the substrate and the mask in a scanning direction and irradiating the substrate with laser light via a plurality of openings in the mask.

The mask has the plurality of openings arranged in the scanning direction of the substrate. The openings can be provided at specific intervals, for example. Each of the plurality of openings includes the first opening area. The respective first opening areas have the same shape and are arranged in a line in the scanning direction. At least one opening among the plurality of openings includes the second opening area that is located in a specific direction with respect to the first opening area and continuous with the first opening area. The specific direction may be a direction perpendicular to the scanning direction, which however should not be taken as a limitation. The specific direction may be the scanning direction.

For example, the number of the plurality of openings is represented by (N+M) and the number of the at least one opening is represented by N. The substrate is moved at a constant speed in the scanning direction and irradiated with laser light at time intervals at which a to-be-irradiated position of the substrate reaches positions corresponding to the openings. Therefore, the same position of the substrate is irradiated with the laser light (N+M) times in one cycle of scanning. The openings have the respective first opening areas of the same shape arranged in a line in the scanning direction. Accordingly, a specific part of the substrate corresponding to the first opening area is irradiated with the laser light (N+M) times in one cycle of scanning. Also, a specific part of the substrate corresponding to the second opening area is irradiated with the laser light N times in one cycle of scanning. Note that the first opening areas can be arranged in a line at constant intervals in the scanning direction.

That is, the part of the substrate corresponding to the first opening area is irradiated with a large amount of laser light, whereby high electron mobility can be achieved in the part of the substrate corresponding to the first opening area. The part of the substrate corresponding to the second opening area, which is located in the specific direction with respect to the first opening area and continuous with the first opening area, is irradiated with a small amount of laser light, whereby an amount of increase in electron mobility can be controlled so as not to become large in the part of the substrate corresponding to the second opening area. Thus, annealing can be performed to achieve different degrees of electron mobility locally by one cycle of scanning, enabling formation of crystalline semiconductor films different from one another in electron mobility.

In the laser annealing device according to an embodiment of the present invention, the at least one opening among the plurality of openings includes paired second opening areas that are located on respective opposite sides of the first opening area in the specific direction and continuous with the first opening area.

The at least one opening among the plurality of openings includes the paired second opening areas that are located on the respective opposite sides of the first opening area in the specific direction and continuous with the first opening area. That is, the paired second opening areas are arranged in the specific direction with the first opening area interposed between the paired second opening areas. The above configuration enables formation of crystalline semiconductor films so as to be arranged in the specific direction in order of a crystalline semiconductor film having relatively high electron mobility, a crystalline semiconductor film having high electron mobility, and a crystalline semiconductor film having relatively high electron mobility by one cycle of scanning.

In the laser annealing device according to an embodiment of the present invention, the specific direction is a direction perpendicular to the scanning direction, and respective dimensions of the first opening area and the second opening area in the scanning direction are substantially equivalent to each other.

The specific direction is the direction perpendicular to the scanning direction, and the respective dimensions of the first opening area and the second opening area in the scanning direction are substantially equivalent to each other. In this configuration, crystalline semiconductor films having substantially equivalent dimensions in the scanning direction and differing from one another in electron mobility can be formed so as to be arranged in the direction perpendicular to the scanning direction in order of a crystalline semiconductor film having relatively high electron mobility, a crystalline semiconductor film having high electron mobility, and a crystalline semiconductor film having relatively high electron mobility.

In the laser annealing device according to an embodiment of the present invention, the specific direction is the scanning direction, and respective dimensions of the first opening area and the second opening area in a direction perpendicular to the scanning direction are substantially equivalent to each other.

The specific direction is the scanning direction, and the respective dimensions of the first opening area and the second opening area in the direction perpendicular to the scanning direction are substantially equivalent to each other. In this configuration, crystalline semiconductor films having substantially equivalent dimensions in the direction perpendicular to the scanning direction and differing from one another in electron mobility can be formed so as to be arranged in the scanning direction in order of a crystalline semiconductor film having relatively high electron mobility, a crystalline semiconductor film having high electron mobility, and a crystalline semiconductor film having relatively high electron mobility.

In the laser annealing device according to an embodiment of the present invention, the first opening area has a rectangular shape.

The first opening area has the rectangular shape. Since the first opening area has the rectangular shape, a part of the substrate corresponding to the first opening area can constitute a gap portion between a source electrode and a drain electrode. Also, the second opening area continuous with the first opening area can constitute an under-electrode region located directly under a part of the source electrode or a part of the drain electrode.

In the laser annealing device according to an embodiment of the present invention, all or some of the plurality of openings include an adjustment member that adjusts an irradiation amount of the laser light.

All or some of the plurality of openings include the adjustment member that adjusts the irradiation amount of the laser light. The adjustment member is formed of a material appropriately selected from materials that reduce an amount of transmittance of the laser light. The first opening area of an opening may be provided with adjustment members arranged in a grid pattern or a slit-like pattern. Alternatively, the first opening area and the second opening area of an opening may be provided with adjustment members arranged in a grid pattern or a slit-like pattern. Through the above, it is possible to adjust an irradiation amount of laser light with which a specific part of the substrate is irradiated in one cycle of scanning to adjust electron mobility of a crystalline semiconductor layer to a specific value.

The laser annealing device according to an embodiment of the present invention includes lenses that are respectively located opposite to the plurality of openings and converge the laser light with which the substrate is to be irradiated via the openings.

The laser annealing device includes the lenses that are respectively located opposite to the plurality of openings and converge the laser light with which the substrate is to be irradiated via the openings. Therefore, the laser annealing device is capable of performing local laser annealing by locally irradiating the substrate in specific parts of the substrate with laser light.

The laser annealing device according to an embodiment of the present invention includes a laser light source that emits the laser light with which the substrate is to be irradiated via the openings.

The laser annealing device includes the laser light source that emits the laser light with which the substrate is to be irradiated via the openings. Therefore, the laser annealing device is capable of performing local laser annealing.

REFERENCE SIGNS LIST

10 Substrate
11 Gate electrode
12 Source electrode
13 Drain electrode
14 Amorphous semiconductor film
15 Crystalline semiconductor film
21 Microlens
30 Mask
31 Mask portion
32 Opening
40 Optical system
50 Laser light source 321 First opening area
322, 323, 324, 325 Second opening area

The invention claimed is:

1. A laser annealing device comprising:
a mask having a plurality of openings arranged in arrays, wherein
the laser annealing device irradiates a substrate with laser light via the openings,
the plurality of openings include one-array openings arranged in a scanning direction as an opening group, the one-array openings each including a first opening area, the respective first opening areas having the same shape and being arranged in a line in the scanning direction, and
at least one opening of the one-array openings includes a second opening area that is located in a specific direction with respect to the first opening area and continuous with the first opening area.

2. The laser annealing device according to claim 1, wherein
the at least one opening of the one-array openings includes paired second opening areas that are located on respective opposite sides of the first opening area in the specific direction and continuous with the first opening area.

3. The laser annealing device according to claim 1, wherein
the specific direction is a direction perpendicular to the scanning direction, and
respective dimensions of the first opening area and the second opening area in the scanning direction are substantially equivalent to each other.

4. The laser annealing device according to claim 1, wherein
the specific direction is the scanning direction, and
respective dimensions of the first opening area and the second opening area in a direction perpendicular to the scanning direction are substantially equivalent to each other.

5. The laser annealing device according to claim 1, wherein
the first opening area has a rectangular shape.

6. The laser annealing device according to claim 1, wherein
all or some of the plurality of openings include an adjustment member that adjusts an irradiation amount of the laser light.

7. The laser annealing device according to claim 1, further comprising
lenses that are respectively located opposite to the plurality of openings and converge the laser light with which the substrate is to be irradiated via the openings.

8. The laser annealing device according to claim 1, further comprising
a laser light source that emits the laser light with which the substrate is to be irradiated via the openings.

9. The laser annealing device according to claim 8, wherein
the laser light source irradiates the substrate with the laser light via the first opening area and the second opening area such that a part of the substrate corresponding to the first opening area has an electron mobility higher than that of a part of the substrate corresponding to the second opening area.

10. A laser annealing method using the laser annealing device according to claim 1, the laser annealing method comprising:
moving a position of one of the substrate and the mask relative to a position of the other of the substrate and the mask in the scanning direction, and
irradiating the substrate with the laser light via the plurality of openings in the mask.

11. The laser annealing device according to claim 1, wherein
the respective first opening areas of the one-array openings have the same size,
the at least one opening of the one-array openings includes openings each including the second opening area, and
the respective second opening areas have the same shape and the same size.

12. A mask having a plurality of openings arranged in arrays, wherein
the plurality of openings include one-array openings arranged in a scanning direction as an opening group, the one-array openings each including a first opening area, the respective first opening areas having the same shape and being arranged in a line in the scanning direction, and
the one-array openings include at least one having a second opening area that is located in a specific direction with respect to the first opening area and continuous with the first opening area.

13. The mask according to claim 12, wherein
the respective first opening areas of the one-array openings have the same size,
the at least one opening of the one-array openings includes openings each including the second opening area, and
the respective second opening areas have the same shape and the same size.

* * * * *